(12) United States Patent
Kang

(10) Patent No.: US 7,145,790 B2
(45) Date of Patent: Dec. 5, 2006

(54) PHASE CHANGE RESISTOR CELL AND NONVOLATILE MEMORY DEVICE USING THE SAME

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 102 days.

(21) Appl. No.: 10/879,517

(22) Filed: Jun. 30, 2004

(65) Prior Publication Data

US 2005/0128798 A1    Jun. 16, 2005

(30) Foreign Application Priority Data

Dec. 13, 2003  (KR) ...................... 10-2003-0090961

(51) Int. Cl.
*G11C 11/00*   (2006.01)
*G11C 11/36*   (2006.01)
(52) U.S. Cl. ........................ 365/148; 365/175
(58) Field of Classification Search ................. 365/46, 365/71, 100, 105, 115, 148, 159, 175
See application file for complete search history.

(56) References Cited

U.S. PATENT DOCUMENTS 3,569,945 A * 3/1971 Ho .............................. 365/175
6,956,767 B1 * 10/2005 Kang .......................... 365/175

* cited by examiner

*Primary Examiner*—Trong Phan
(74) *Attorney, Agent, or Firm*—Heller Ehrman LLP

(57) ABSTRACT

A nonvolatile memory device features a phase change resistor cell. The nonvolatile memory device using a phase change resistor cell comprises a plurality of phase change resistor cell arrays, a plurality of word line driving units and a plurality of sense amplifiers. Each of the plurality of phase change resistor cell arrays includes unit phase change resistor cells, and each unit phase change resistor cell is located where a word line and a bit line are crossed in row and column directions. The plurality of word line driving units selectively drive the word lines. The plurality of sense amplifiers sense and amplify data transmitted through the bit lines. Here, the unit phase change resistor cell comprises a phase change resistor and a hybrid switch. The phase change resistor stores a logic data value corresponding to a resistance sate changed by a crystallization state of a phase change material depending on the amount of current supplied from a word line. The hybrid switch is connected between the phase change resistor and a bit line, and selectively switched depending on a voltage applied to the word line and the bit line. As a result, a cross-point cell array is embodied, and the whole chip size is reduced.

21 Claims, 13 Drawing Sheets

PHASE CHANGE RESISTOR CELL AND NONVOLATILE MEMORY DEVICE USING THE SAME

BACKGROUND OF THE INVENTION

1. Field of the Invention

The present invention generally relates to a memory device, and more specifically, to a phase change resistor cell and a nonvolatile memory device using the same which improve the whole size of the nonvolatile memory device by embodying a cross-point cell with a phase change resistor and a hybrid switch.

2. Description of the Prior Art

In general, nonvolatile memories such as a magnetic memory and a phase change memory (hereinafter, referred to as "PCM") has a data processing speed as fast as a volatile Random Access Memory (hereinafter, referred to as "RAM") and conserves data even after the power is turned off.

FIGS. 1a to 1d are diagrams illustrating a conventional phase change resistor 4 (hereinafter, referred to as "PCR").

The PCR 4 comprises a top electrode 1, a bottom electrode 3 and a PCM 2 inserted therebetween. If a voltage or current is applied to the PCR 4, the PCM 2 reaches a high temperature state. As a result, resistance is changed, and then an electric conduction state is also changed. Here, AgInSbTe has been widely used as the PCM 2.

As shown in FIG. 1c, if low current having less than a threshold value flows in the PCR 4, the PCM 2 is heated to a proper temperature for crystallization. As a result, the PCM 2 is changed into a crystalline phase, and the PCR 4 reaches a low resistance state.

On the other hand, as shown in FIG. 1d, if high current having more than the threshold value flows in the PCR 4, the PCM 2 is heated at a temperature of over a melting point. AS a result, the PCM 2 is changed into an amorphous phase, and reaches a high resistance state.

As described above, the PCR 4 can store data corresponding to the states of two resistances as nonvolatile sates. In other words, if the low resistance state of the PCR 4 refers to data "1" and the high resistance state of the PCR 4 refers to data "0", the PCR 4 can store logic values of the two data.

Meanwhile, the conventional memory device comprises a switch device and a memory device for storing data. Here, the switching device of the conventional memory device is a NMOS transistor whose switching operation is controlled by a gate control signal.

However, the above-described NMOS transistor requires an additional area for gate control when a cell array is embodied with a switching device, which results in increase of the whole chip size.

SUMMARY OF THE INVENTION

Accordingly, it is a first object of the present invention to reduce the whole size of a nonvolatile memory device by embodying a cross-point cell with a PCR and a hybrid switch which does not require an additional gate control signal.

It is a second object of the present invention to improve operation characteristics of a memory cell by effectively driving read/write operations in a cell array using the above-described PCR and the hybrid switch.

In an embodiment, a phase change resistor cell comprises a phase change resistor and a hybrid switch. The phase change resistor stores a logic data value corresponding to a resistance state changed by a crystallization state of a phase change material depending on the amount of current supplied from a word line. The hybrid switch is connected between the phase change resistor and a bit line, and selectively switched depending on a voltage applied to the word line and the bit line.

In an embodiment, a nonvolatile memory device using a phase change resistor cell comprises a plurality of phase change resistor cell arrays, a plurality of word line driving units and a plurality of sense amplifiers. Each of the plurality of phase change resistor cell arrays includes unit phase change resistor cells, and each unit phase change resistor cell is located where a word line and a bit line are crossed in row and column directions. The plurality of word line driving units selectively drive the word lines. The plurality of sense amplifiers sense and amplify data transmitted through the bit lines. Here, the unit phase change resistor cell comprises a phase change resistor and a hybrid switch. The phase change resistor stores a logic data value corresponding to a resistance sate changed by a crystallization state of a phase change material depending on the amount of current supplied from a word line. The hybrid switch is connected between the phase change resistor and a bit line, and selectively switched depending on a voltage applied to the word line and the bit line.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1A:
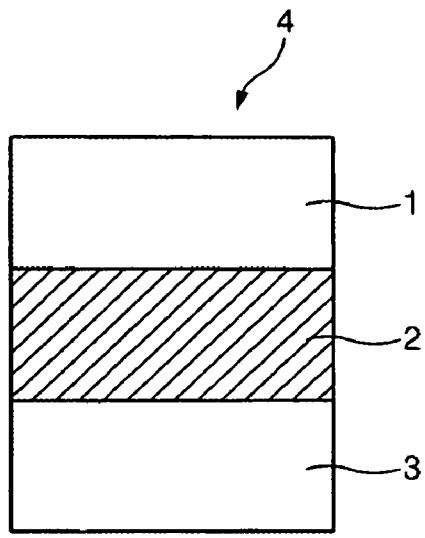
FIGS. 1a to 1d are diagrams illustrating a conventional phase change resistor.
Figure 1B:
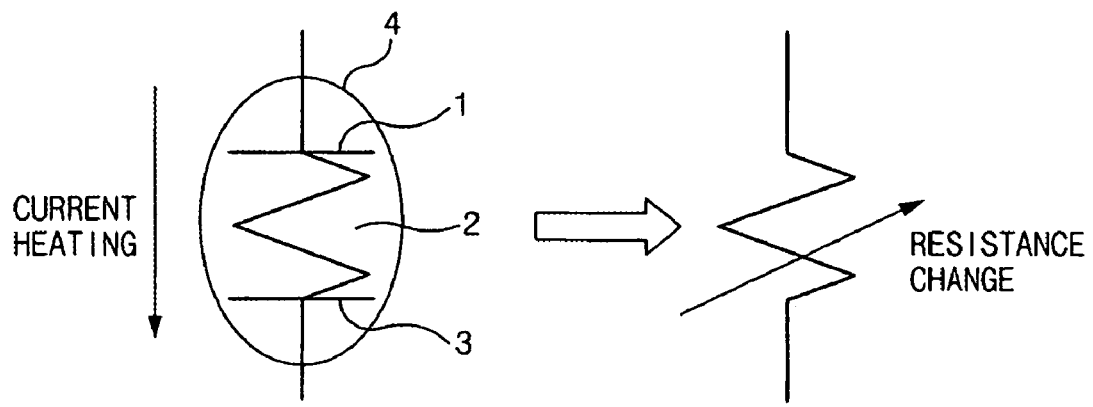
Figure 1C:
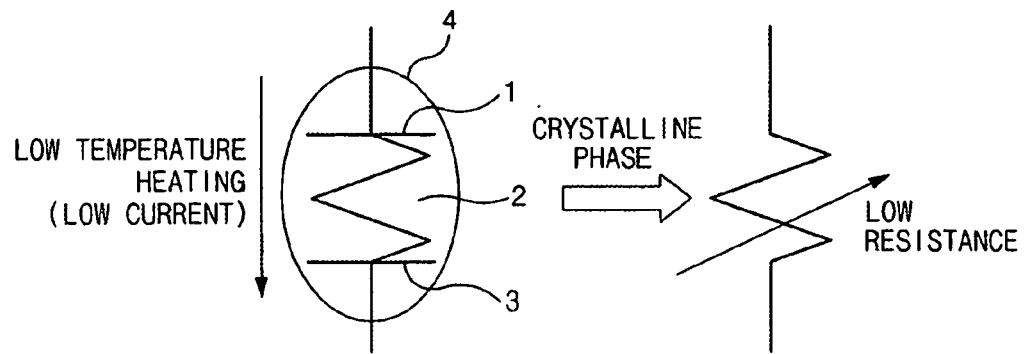
Figure 1D:
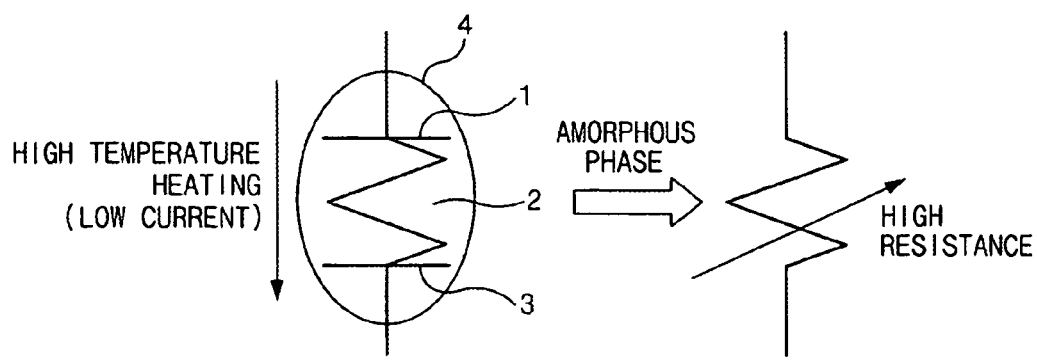
Figure 2:
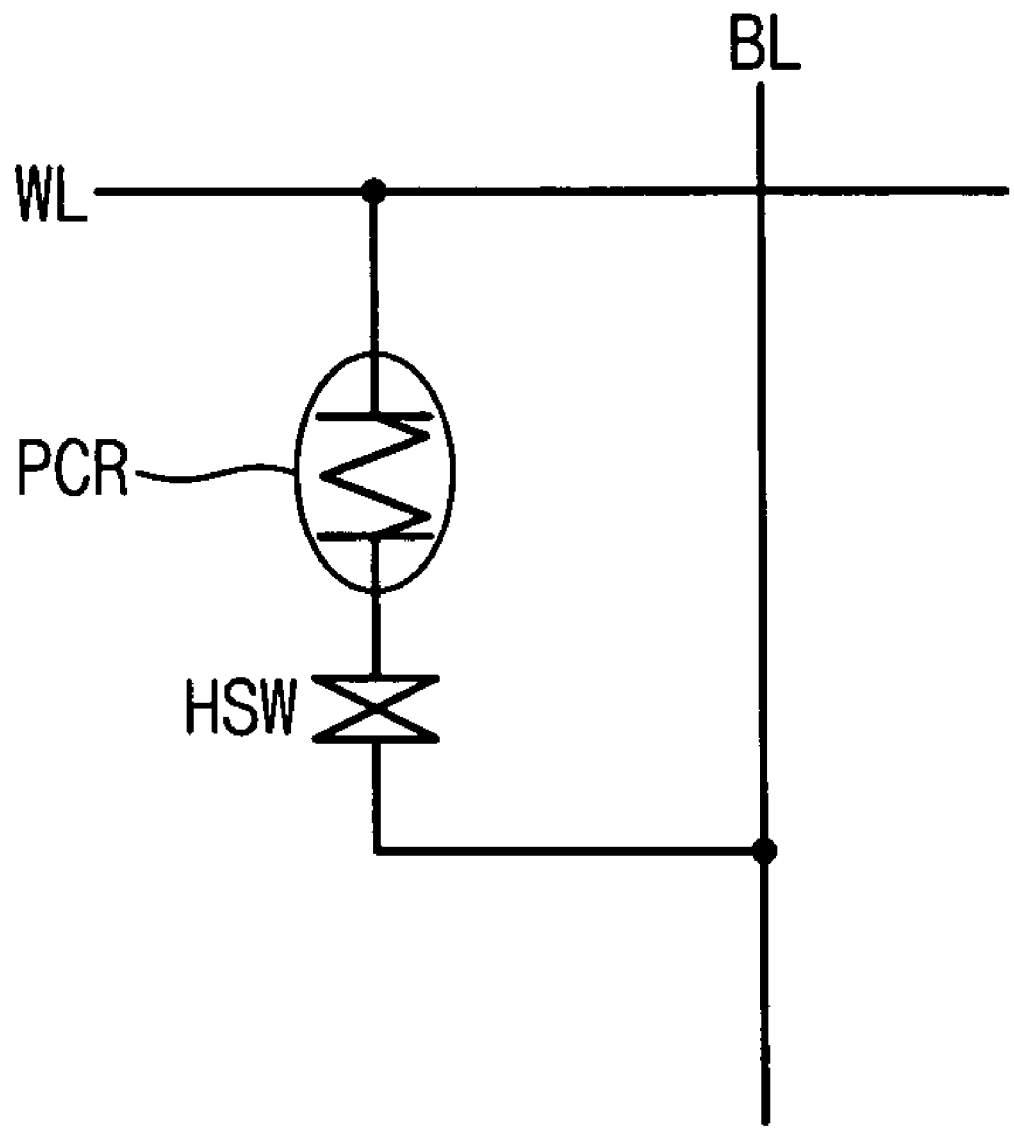
FIG. 2 is a circuit diagram of a phase change resistor cell according to an embodiment of the present invention.

FIG. 2 is a circuit diagram of a phase change resistor cell according to an embodiment of the present invention.

A PCR cell comprises a PCR and a hybrid switch HSW which are connected serially. Here, the hybrid switch HSW is connected to a bit line BL, and the PCR is connected to a word line WL.

Figure 3:
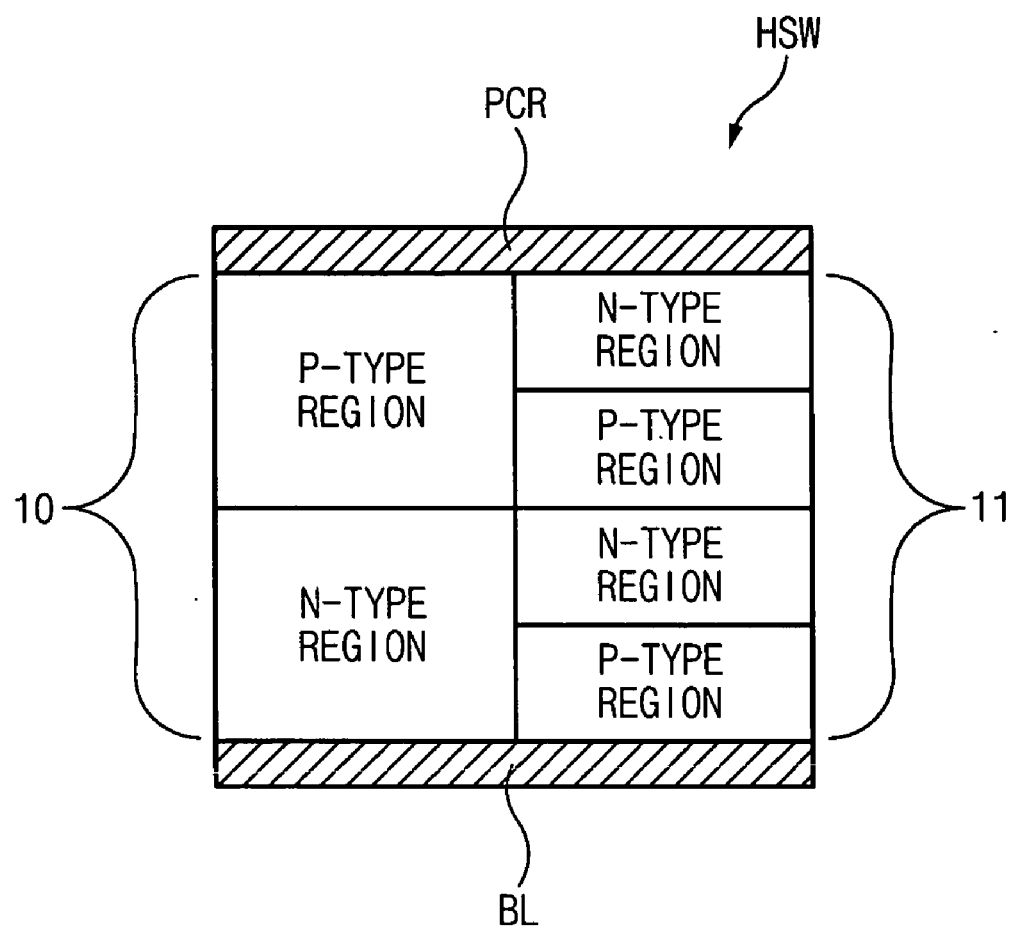
FIG. 3 is a cross-sectional diagram of a hybrid switch of FIG. 2.

FIG. 3 is a cross-sectional diagram of the hybrid switch HSW of FIG. 2.

The hybrid switch HSW is formed between the PCR at the top and the bit line BL at the bottom. The hybrid switch HSW is horizontally divided into a PN diode switch 10 and a PNPN diode switch 11. A P-type region is deposited on a N-type region on the PN diode switch 10, and a P-type region, a N-type region, a P-type region and a N-type region are sequentially deposited in the PNPN diode switch 11.

The bottom of the PN diode switch 10 and the PNPN diode switch 11 is contacted with the bit line BL, and the top of the PN diode switch 10 and the PNPN diode switch 11 is contacted with the PCR.

The above-described hybrid switch HSW is represented by a symbol as shown in FIG. 2.

Figure 4:
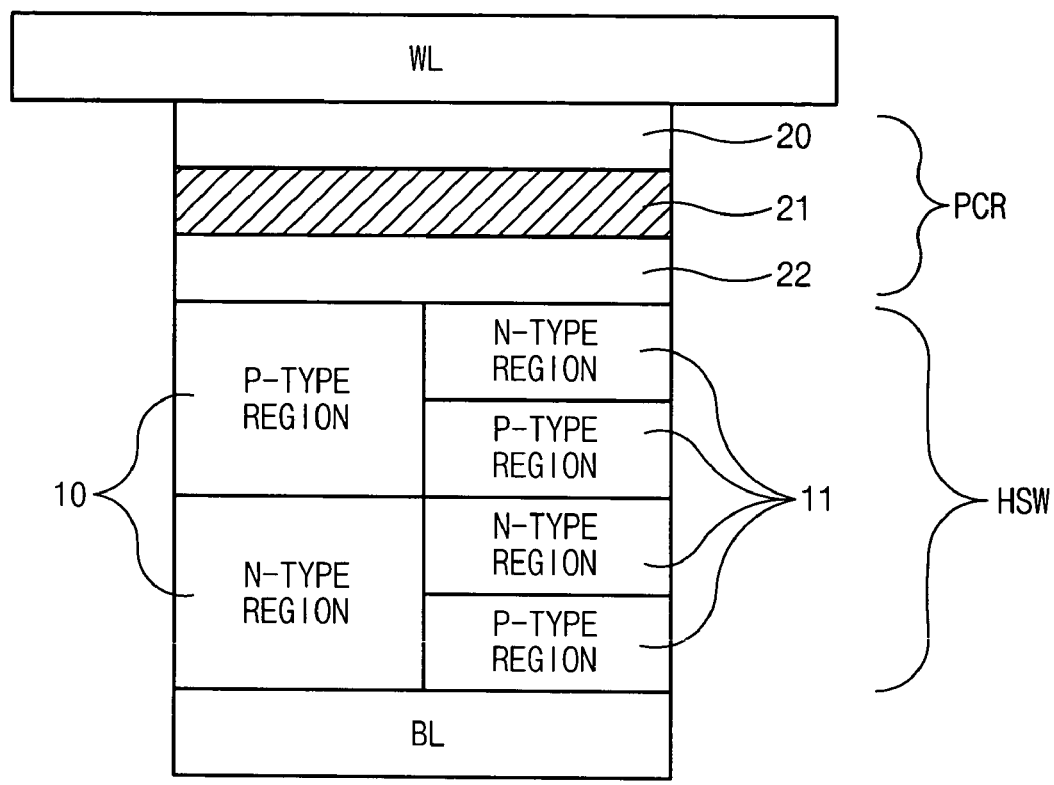
FIG. 4 is a cross-sectional diagram of a phase change resistor cell according to an embodiment of the present invention.

FIG. 4 is a cross-sectional diagram of a phase change resistor cell according to an embodiment of the present invention.

In the PCR cell, a bit line is formed at bottom, and a hybrid switch HSW having the structure described in FIG. 3 is deposited on the bit line. Then, a PCR is deposited on the hybrid switch HSW, and a word line is deposited on the PCR.

Here, the PCR comprises a top electrode 20, a PCM 21 and a bottom electrode 22. The top electrode 20 of the PCR is contacted with the word line WL, and the bottom electrode 22 is contacted with the top of the PN diode switch 10 and the PNPN diode switch 11.

The bit line BL is contacted with the bottom of the PN diode switch 10 and the PNPN diode switch 11.

Figure 5:
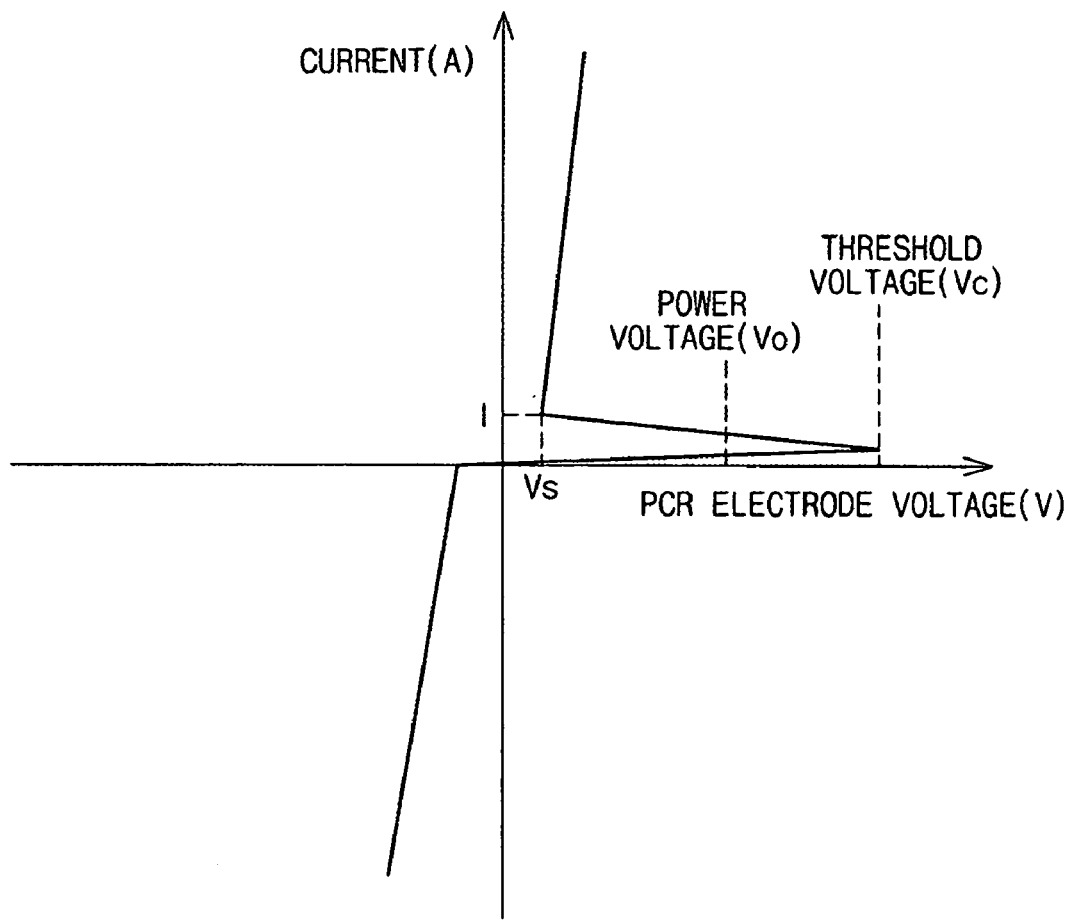
FIG. 5 is a diagram illustrating the operation of the hybrid switch of FIG. 3.

FIG. 5 is a diagram illustrating the operation of the hybrid switch HSW of FIG. 3.

Although a voltage applied to the PCR increases toward a positive direction on the basis of the bit line BL and reaches a power voltage Vo, the hybrid switch HSW is kept off by operation characteristics of the PNPN diode switch 11. As a result, current does not flow in the PCR.

Thereafter, if the voltage applied to the PCR more increases and reaches a threshold voltage Vc, the PNPN diode switch 11 of the hybrid switch HSW is turned on depending on forward operation characteristics of the diode. As a result, the amount of current remarkably increases. Here, when the voltage applied to the PCR is over the threshold voltage Vc, a value of current I is affected by resistance (not shown) connected to the PCR to serve as load.

After the PNPN diode switch 11 is turned on, the large amount of current can flow although a small voltage Vs is applied to the PCR. Here, the PN diode switch 10 is kept off by reverse operation characteristics.

On the other hand, if a predetermined voltage is applied to the word line WL and the voltage applied to the PCR increases toward a negative direction on the basis of the bit line BL, the hybrid switch HSW is turned on by forward operation characteristics of the PN diode switch 10. Then, current flows at a random operation voltage state. Here, the PNPN diode switch 11 is kept off by reverse operation characteristics.

Figure 6:
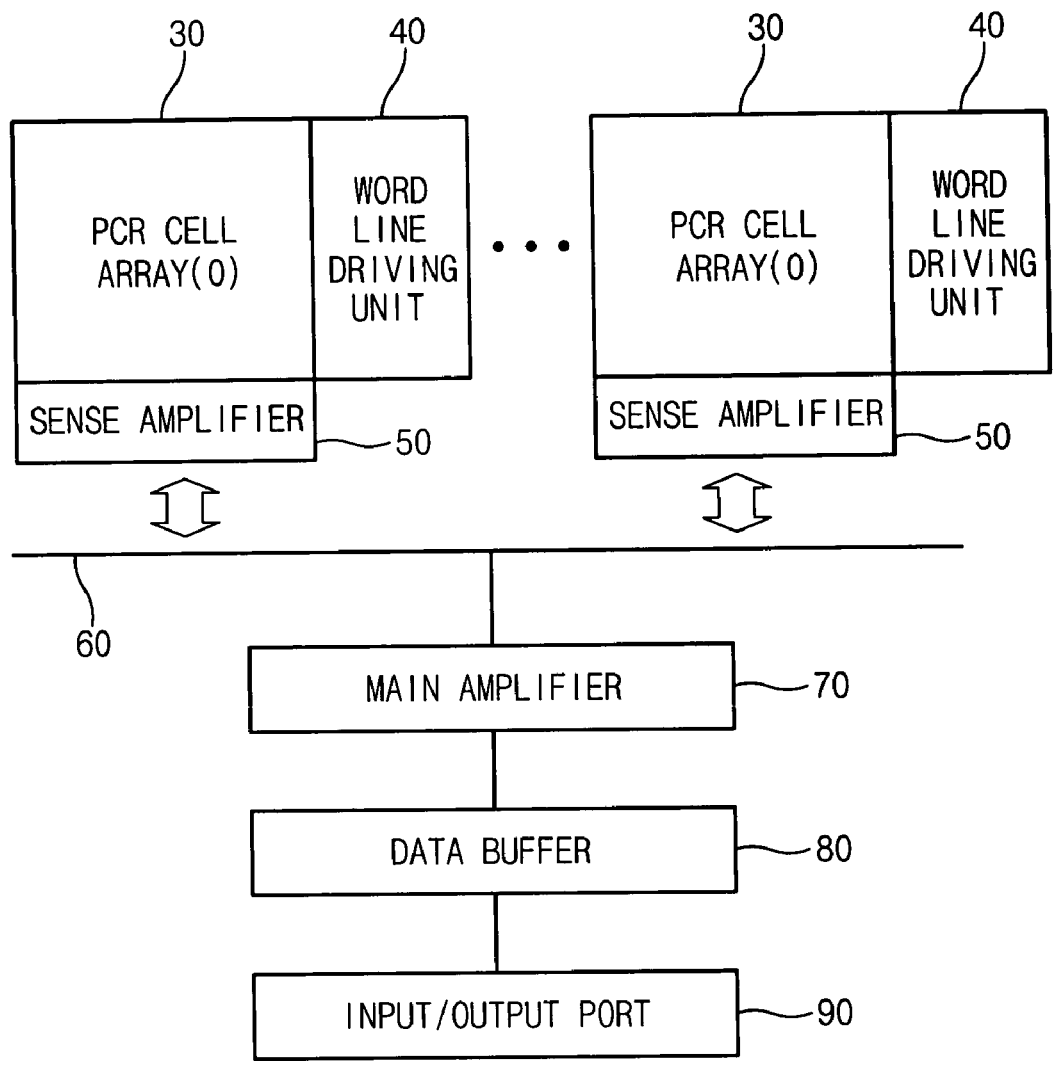
FIG. 6 is a diagram of a nonvolatile memory device suing a phase change resistor cell according to an embodiment of the present invention.

FIG. 6 is a diagram of a nonvolatile memory device suing a phase change resistor cell according to an embodiment of the present invention.

In an embodiment, the nonvolatile memory device comprises a plurality of PCR cell arrays 30, a plurality of word line driving units 40, a plurality of sense amplifiers 50, a data bus 60, a main amplifier 70, a data buffer 80 and an input/output port 90.

Each PCR cell array 30 comprises a plurality of PCR cells arranged in row and column directions as described in FIG. 2. A plurality of word lines WL arranged in the row direction are connected to the word line driving unit 40. A plurality of bit lines BL arranged in the column direction are connected to the sense amplifier 50.

Here, one PCR cell array 30 are correspondingly connected to one word line driving unit 40 and one sense amplifier 50.

The plurality of sense amplifiers 50 share one data bus 60. The data bus 60 is connected to the main amplifier 70 which amplifies data applied from each sense amplifier 50 through the data bus 60.

The data buffer 80 buffers the amplified data applied from the main amplifier 70. The input/output port 90 outputs output data applied from the data buffer 80 to the outside or applies input data applied from the outside to the data buffer 80.

Figure 7:
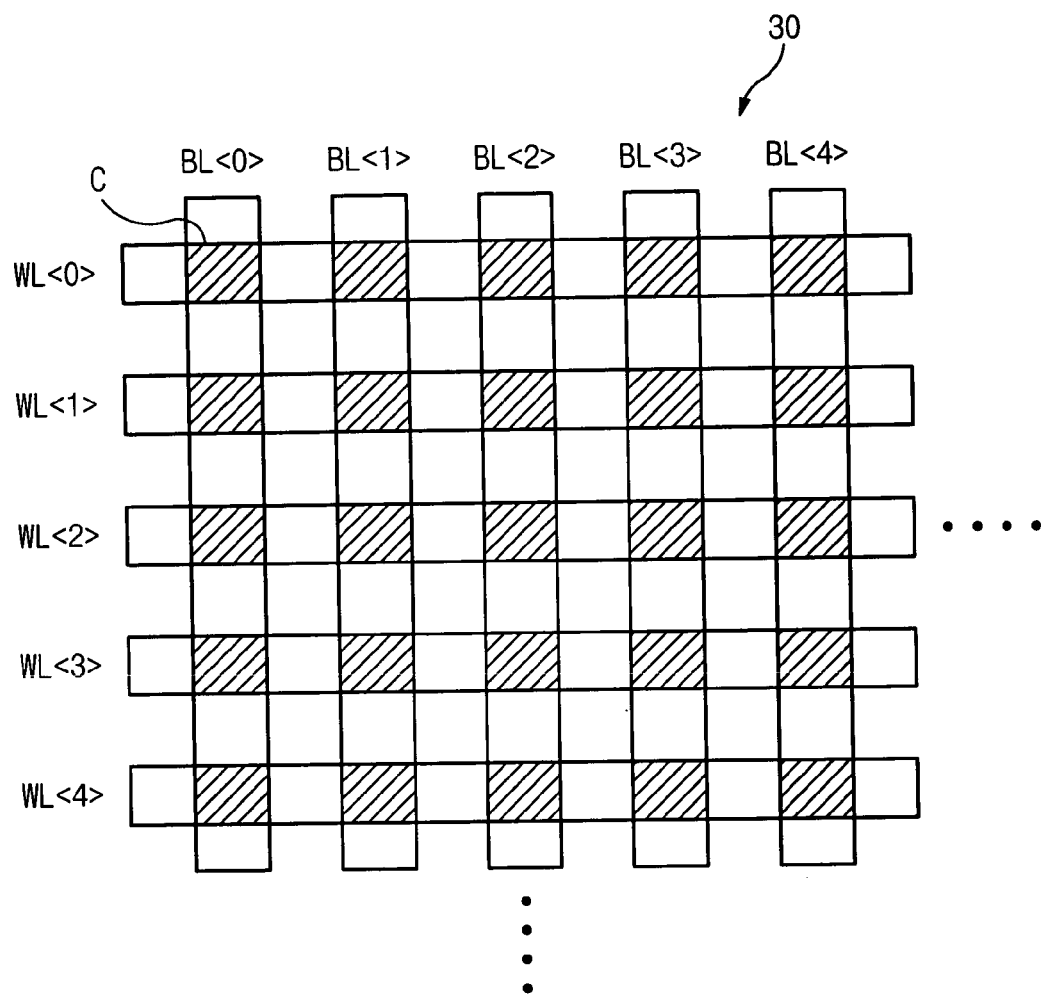
FIG. 7 is a layout diagram of a phase change resistor cell array of FIG. 6.

FIG. 7 is a layout diagram of the phase change resistor cell array 30 of FIG. 6.

The PCR cell array 30 comprises a plurality of word lines WL arranged in the row direction and a plurality of bit lines BL arranged in the column directions. A unit cell C is located only where the word line WL and the bit line BL are crossed. That is, a cross-point cell is embodied. Since it is unnecessary to form devices in other regions, a cell can be formed in a space necessary to form the word line WL and the bit line BL without requiring an additional area.

Here, the cross-point cell refers to a PCR cell using a hybrid switch HSW located where a bit line BL and a word line WL are crossed.

Figure 8:
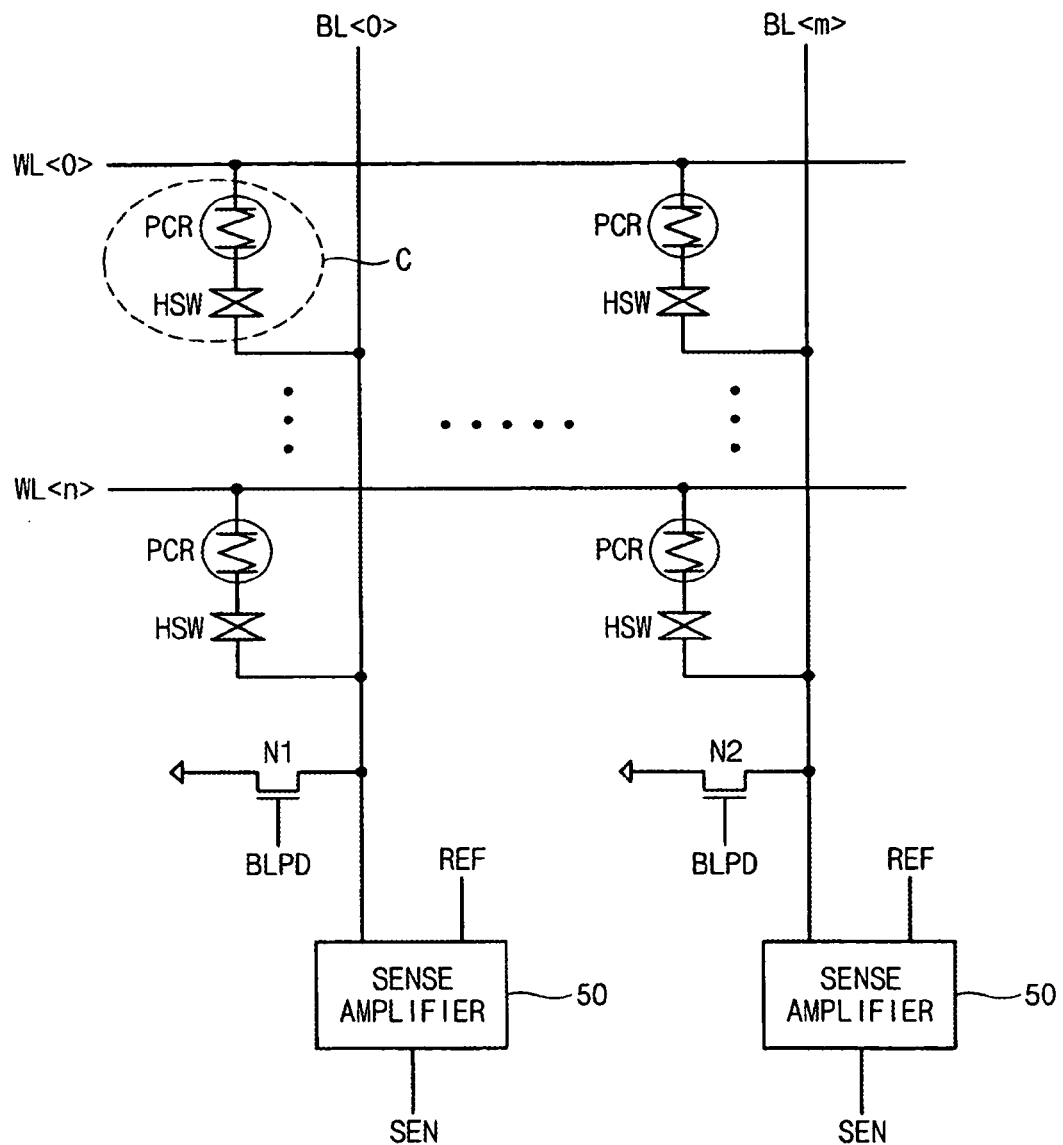
FIGS. 8 and 9 are diagrams illustrating examples of the phase change resistor cell array of FIG. 6.

FIG. 8 is a circuit diagram of the PCR cell array 30 of FIG. 6.

The PCR cell array 30 comprises a plurality of word lines WL<0>~WL<n> arranged in the row direction and a plurality of bit lines BL<0>~BL<m> arranged in the column direction. A unit cell C is located only where the word line WL and the bit line BL are crossed. Here, the unit cell C comprises a PCR and a hybrid switch HSW.

The plurality of sense amplifiers 50 are connected one by one to the bit lines BL. Each sense amplifier 50 compares a voltage applied from the bit line BL with a reference voltage REF previously set when a sense amplifier enable signal SEN is activated, and amplifies the comparison result.

A bit line pull-down device N1 is connected to the bit line BL<0>, and a bit line pull-down device N2 is connected to the bit line BL<m>. When a bit line pull-down signal BLPD is activated, the bit line pull-down devices N1 and N2 apply a ground voltage to the bit line BL and pull down the bit line BL to a ground level.

The above-described PCR cell array 30 is operated so that each PCR may store one data.

Figure 9:
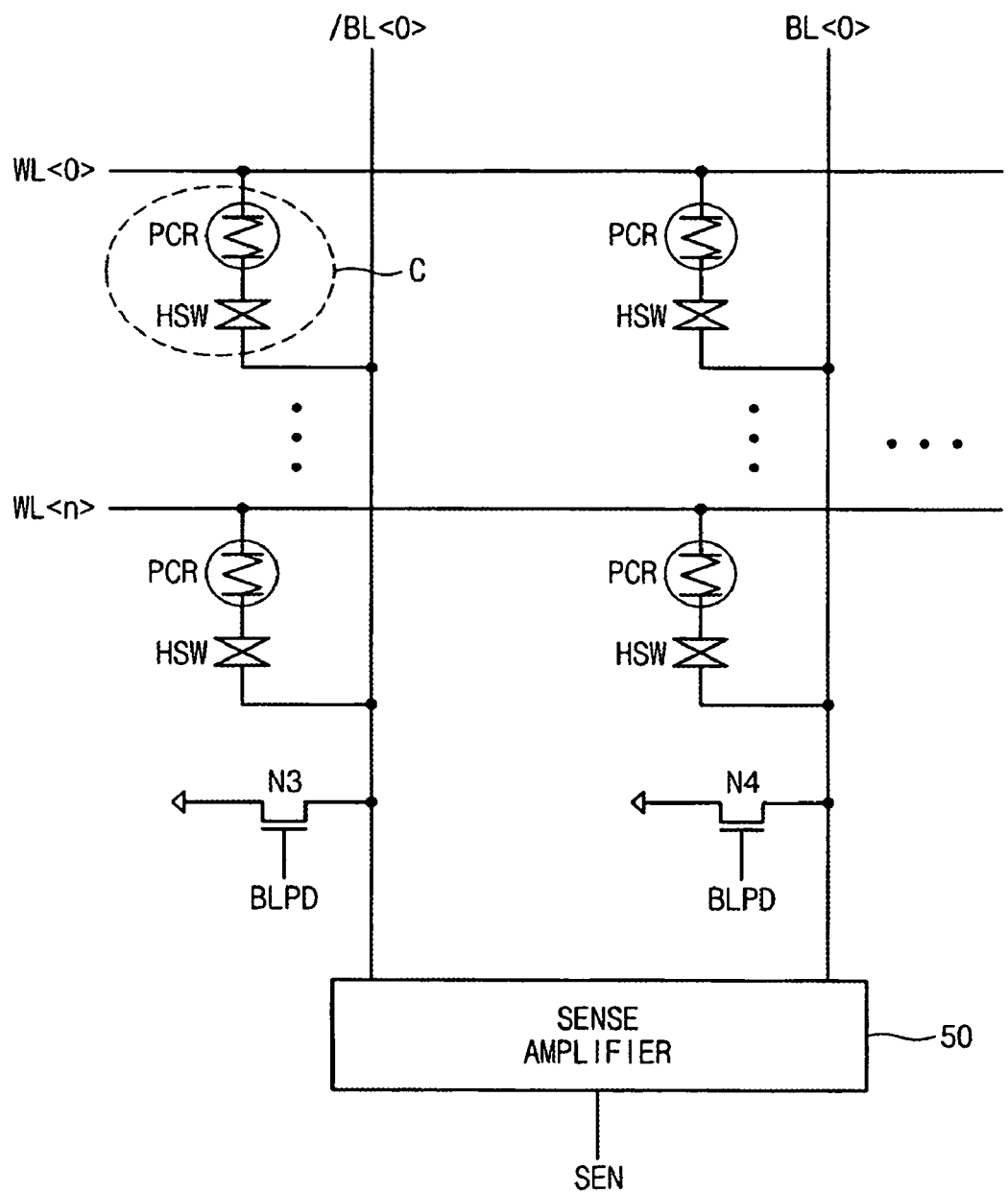

FIG. 9 shows another example of the PCR cell array 30 of FIG. 6.

The PCR cell array 30 comprises a plurality of word lines WL<0>~WL<n> arranged in the row direction and a plurality of paired bit lines BL and /BL arranged in the column direction. A unit cell C is located only where the paired bit lines BL and /BL are crossed. The unit cell C comprises a PCR and a hybrid switch HSW.

One sense amplifier 50 is connected one by one to the paired bit lines BL and /BL. When a sense amplifier enable signal SEN is activated, each sense amplifier 50 is simultaneously operated to amplify data applied from the paired bit lines BL and /BL.

A bit line pull-down device N3 is connected to the bit line /BL<0>, and a bit line pull-down device N4 is connected to the bit line BL<0>. As a result, when a bit line pull-down signal BLPD is activated, the bit line pull-down devices N3 and N4 apply a ground voltage to the paired bit lines BL and /BL, and pull down the paired bit lines BL and /BL to a ground voltage level.

The above-described PCR cell array 30 is operated so that two PCRs may store one data.

Figure 10:
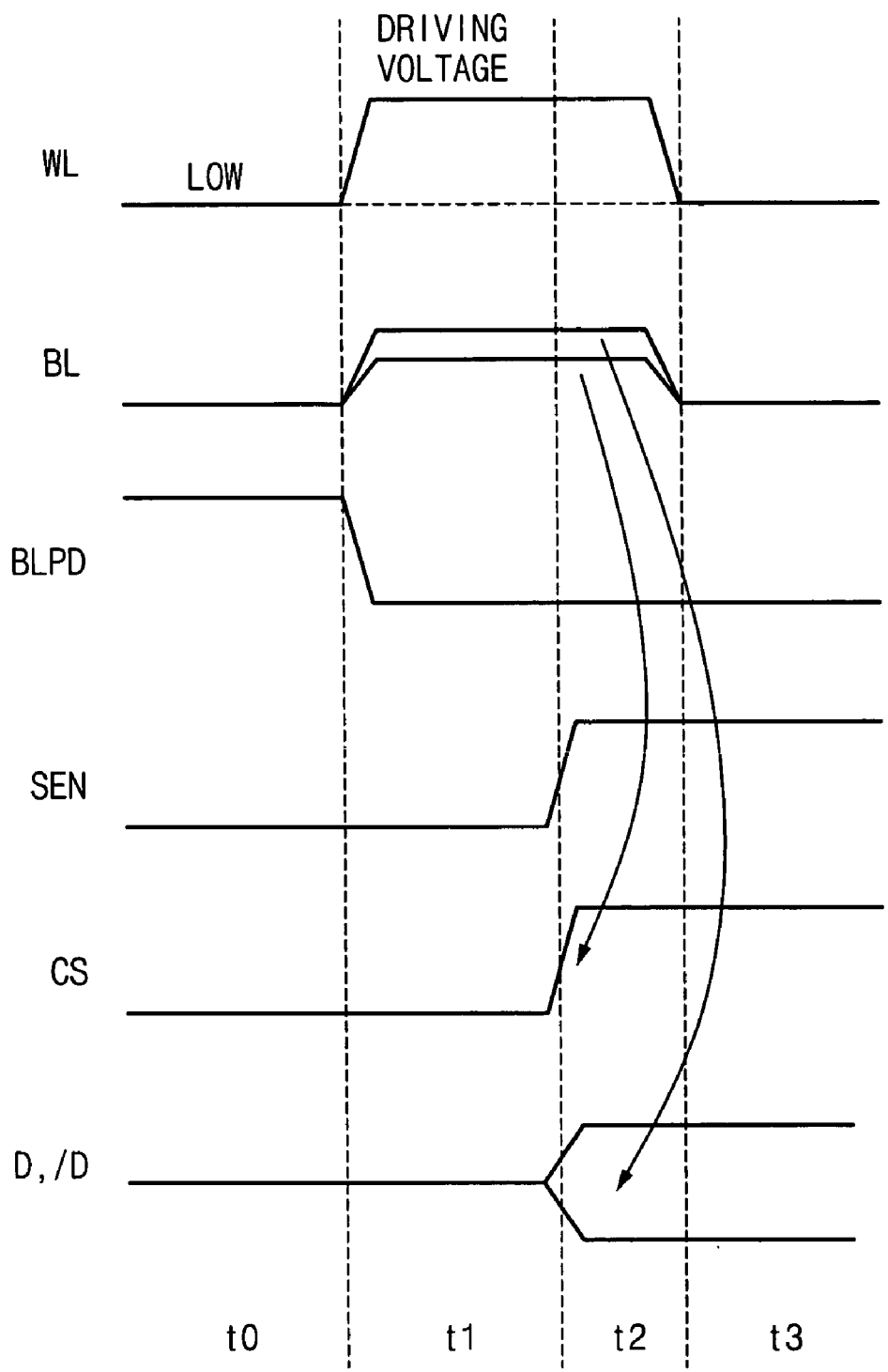
FIG. 10 is a timing diagram illustrating the read mode of the nonvolatile memory device using a phase change resistor cell according to an embodiment of the present invention.

FIG. 10 is a timing diagram illustrating the read mode of the nonvolatile memory device using a phase change resistor cell according to an embodiment of the present invention.

In an interval t0, the bit line pull-down signal BLPD is activated to turn on the NMOS transistors N1 and N2. As a result, the bit line BL is pulled down to the ground level.

When an interval t1 starts, if the word line WL transits to 'high' and a predetermined voltage is applied to the word line WL, the PN diode 10 of the hybrid switch HSW is turned on. As a result, data of the PCR cell are transmitted to the bit line BL. Here, the bit line pull-down signal BLPD transits to 'low'.

Next, in an interval t2, if the sense amplifier enable signal transits to 'high', the sense amplifier 50 is operated to amplify data applied from the bit line BL. If a column selecting signal CS transits to 'high', a column selecting switching unit (not shown) is turned on. As a result, data D and /D in the bit line BL are outputted to the data bus 60 to read data stored in the PCR cell C.

Thereafter, when an interval t3 starts, if the word line transits to 'low', the PCR cell is disconnected from the bit line BL. As a result, the read operation is completed. Here, the PN diode switch 10 and the PNPN diode switch 11 of the hybrid switch HSW are kept off.

Figure 11:
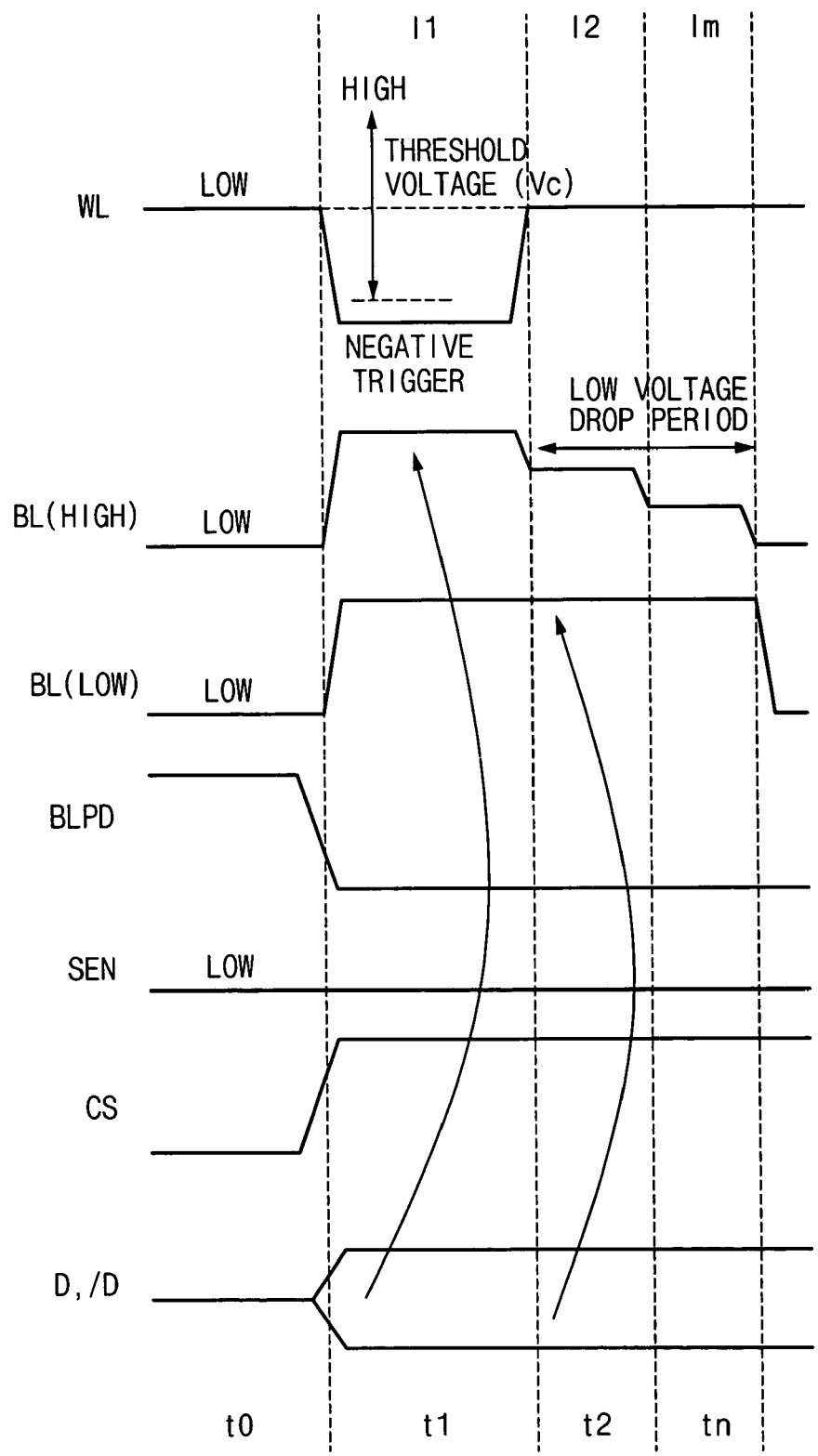
FIG. 11 is a timing diagram illustrating the write mode of the nonvolatile memory device using a phase change resistor cell according to an embodiment of the present invention.

FIG. 11 is a timing diagram illustrating the write mode of the nonvolatile memory device using a phase change resistor cell according to an embodiment of the present invention.

In the write mode, the sense amplifier enable signal SEN is maintained at the low level.

In an interval t0, the bit line pull-down signal BLPD is activated to turn on the NMOS transistors N1 and N2. As a result, the bit line BL is pulled down to the ground level.

Thereafter, when an interval t1, the bit line pull-down signal BLPD transits to 'low'. If the column selecting signal CS transits to 'high', the column selecting switching unit (not shown) is turned on, and new data D and /D to be written through the data bus 60 are inputted to the bit line BL. Here, suppose that the data applied to the bit line BL in the write mode are 'high' or 'low'.

At this sate, a voltage of the word line WL transits to a negative voltage which corresponds to a value of less than the threshold voltage Vc. That is, a difference between a low voltage level of the bit line BL and a negative voltage level of the word line WL does not reach to the level of the threshold voltage Vc to turn on the PNPN diode switch 11 of the hybrid switch HSW.

However, a voltage of over the threshold voltage Vc to turn on the PNPN diode switch 11 is applied to the hybrid switch HSW by a difference between a high amplifying voltage of the bit line BL and a negative voltage of the word line WL. As a result, the PNPN diode switch 11 is turned on to write data in the PCR.

After PNPN diode switch 11 is turned on, a large amount of current I1 can flow although a small voltage Vs is applied to the PCR as shown in the operation characteristics of FIG. 5. As a result, the sufficient amount of current flows to write data in the PCR even when the voltage of the word line WL rises from the negative voltage level to the low level after the interval t1.

Thereafter, during intervals t2~tn, the voltage level is controlled to drop differently depending on patterns of data applied to the bit line BL.

In other words, when a voltage level having a high data value is applied to the bit line BL, the voltage level of the bit line BL is controlled to drop step by step during the intervals t2~tn. As a result, current is changed into current I2 and Im. On the other hand, when a voltage level having a data low value is applied to the bit line BL, the voltage level of the bit line BL is continuously controlled to the high state during the intervals t2~tn.

Figure 12:
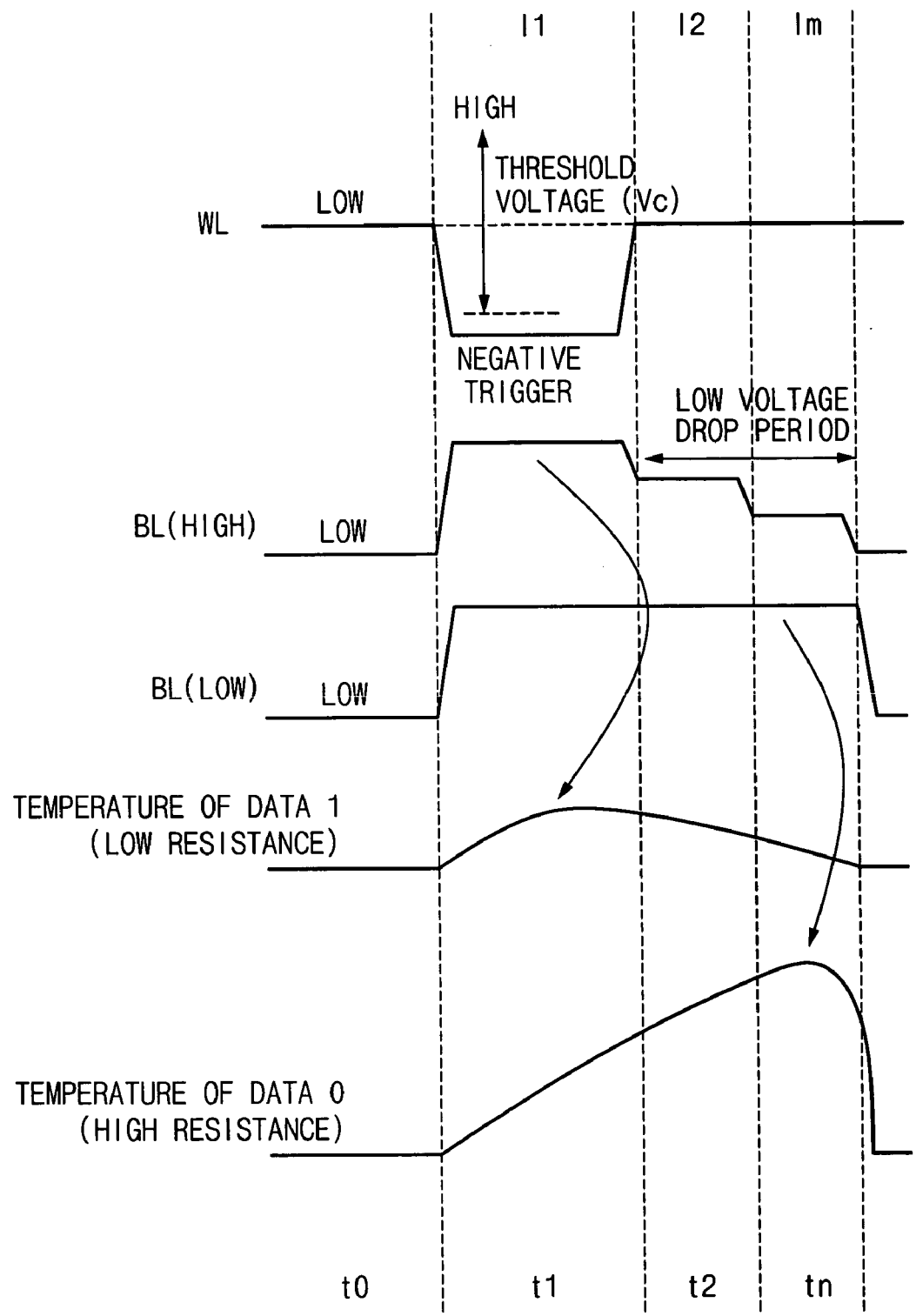
FIG. 12 is a diagram illustrating temperature characteristics of the phase change resistor cell in the write mode of the nonvolatile memory device suing a phase change resistor cell according to an embodiment of the present invention.

As shown in FIG. 12, when data in the bit line BL is 'high', the melting temperature of the PCR is constantly maintained at a low temperature so that the crystalline state may be kept. The level of the voltage applied to the bit line BL drops step by step to maintain the crystalline sate. As a result, in the interval t1, a temperature characteristic of data 'high' reaches the peak and then gradually decreases, and the PCR represent a low resistance characteristic.

If the level of the voltage applied to the bit line BL is constantly maintained, the temperature of the PCR rises and the PCR is changed into an amorphous state. Therefore, the level of the voltage applied to the bit line BL drops step by step to maintain the crystalline temperature.

On the other hand, when data in the bit line BL is 'low', the level of the voltage applied to the bit line BL is constantly maintained to increase the melting temperature of the PCR which is maintained at the amorphous state. As the melting temperature of the PCR becomes higher, the PCR represents a higher resistance characteristic, and the property of the PCR having the amorphous state is improved. As a result, when a predetermined voltage is applied to the bit line BL, the temperature of the PCR rises so that the PCR is continuously maintained at the amorphous state.

Here, a restoration operation is not required because data are stored in the PCR having a nonvolatile characteristic.

As discussed earlier, a nonvolatile memory device using a phase change resistor cell according to an embodiment of the present invention reduces the whole size of the nonvolatile memory by embodying a cross-point cell with a phase change resistor device and a hybrid switch which does not require a gate control signal. Additionally, the operation characteristics of the memory cell are improved by effectively driving the read/write operation in a cell array using the phase change resistor device and the hybrid switch.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A phase change resistor cell comprising:
   a phase change resistor for storing a logic data value corresponding to a resistance state changed by a crystallization state of a phase change material depending on the amount of current supplied from a word line; and
   a hybrid switch connected between the phase change resistor and a bit line, and selectively switched depending on a voltage applied to the word line and the bit line.

2. The phase change resistor cell according to claim 1, wherein the bit line, the hybrid switch, the phase change resistor and the word line are sequentially deposited, and the phase change resistor and the hybrid switch are formed where the word line and the bit line are crossed.

3. The phase change resistor cell according to claim 1, wherein the hybrid switch comprises:
a first switching unit for reading data of the phase change resistor if a first voltage having over a predetermined level is applied to the word line; and
a second switching unit for writing data in the phase change resistor if a second voltage higher than the first voltage is applied to the bit line.

4. The phase change resistor cell according to claim 3, wherein the bit line, the hybrid switch, the phase change resistor and the word line are sequentially deposited,
a top of the first switching unit and the second switching unit is contacted with the phase change resistor, and a bottom of the first switching unit and the second switching unit is contacted with the bit line,
each of the first switching unit and the second switching unit comprises at least one or more PN diodes formed vertically, and
the second switching unit is configured to have more deposited PN diodes than the first switching unit.

5. The phase change resistor cell according to claim 4, wherein the hybrid switch comprises the first switching unit including a PN diode and the second switching unit including PNPN diodes.

6. The phase change resistor cell according to claim 5, wherein the PN diode switch is connected in a forward direction and the PNPN diode switch is connected in a reverse direction.

7. The phase change resistor cell according to claim 5, wherein the hybrid switch reads cell data of the phase change resistor to the bit line if a high level voltage is applied to the word line to turn on the PN diode, and
the hybrid switch writes data of the bit line to the phase change resistor if a negative trigger voltage is applied to the word line to turn on the PNPN diodes.

8. The phase change resistor cell according to claim 7, wherein after the negative trigger voltage is applied, a voltage level of the bit line drops step by step when data of the bit line are at a high level, and a voltage level of the bit line is constantly maintained when data of the bit line is at a low level.

9. A nonvolatile memory device using a phase change resistor cell, comprising:
a plurality of phase change resistor cell arrays including unit phase change resistor cells each located where a word line and a bit line are crossed;
a plurality of word line driving units for selectively driving the word lines;
a plurality of sense amplifiers for sensing and amplifying data transmitted through the bit lines,
wherein the unit phase change resistor cell comprises:
a phase change resistor for storing a logic data value corresponding to a resistance state changed by a crystallization state of a phase change material depending on the amount of current supplied from a word line; and
a hybrid switch connected between the phase change resistor and a bit line, and selectively switched depending on a voltage applied to the word line and the bit line.

10. The nonvolatile memory device according to claim 9, wherein the bit line, the hybrid switch, the phase change resistor and the word line are sequentially deposited, and the phase change resistor and the hybrid switch are formed where the word line and the bit line are crossed.

11. The nonvolatile memory device according to claim 9, wherein the hybrid switch comprises:
a first switching unit for reading data of the phase change resistor if a first voltage having over a predetermined level is applied to the word line; and
a second switching unit for writing data in the phase change resistor if a second voltage higher than the first voltage is applied to the bit line.

12. The nonvolatile memory device according to claim 11, wherein the bit line, the hybrid switch, the phase change resistor and the word line are sequentially deposited,
an upper portion and a lower portion of the first switching unit and the second switching unit are contacted in common to the phase change resistor and the bit line,
each of the first switching unit and the second switching unit comprises at least one or more PN diodes formed vertically, and
the second switching unit is configured to have more deposited PN diodes than the first switching unit.

13. The nonvolatile memory device according to claim 12, wherein the hybrid switch comprises the first switching unit including a PN diode and the second switching unit including PNPN diodes.

14. The nonvolatile memory device according to claim 13, wherein the PN diode switch is connected in a forward direction and the PNPN diode switch is connected in a reverse direction.

15. The nonvolatile memory device according to claim 13, wherein the hybrid switch reads cell data of the phase change resistor to the bit line if a high level voltage is applied to the word line to turn on the PN diode, and
the hybrid switch writes data of the bit line to the phase change resistor if a negative trigger voltage is applied to the word line to turn on the PNPN diodes.

16. The nonvolatile memory device according to claim 15, wherein after the negative trigger voltage is applied, a voltage level of the bit line drops step by step when data of the bit line are at a high level, and a voltage level of the bit line is constantly maintained when data of the bit line is at a low level.

17. The nonvolatile memory device according to claim 9, further comprising:
a data bus shared by the plurality of sense amplifiers;
a main amplifier for amplifying data of the data bus;
a data buffer for buffering data inputted/outputted in the main amplifier; and
an input/output port, connected to the data buffer, and for inputting/outputting data.

18. The nonvolatile memory device according to claim 9, wherein each of the plurality of phase change resistor cell arrays further comprises a plurality of bit line pull-down devices connected one by one to the plurality of the bit lines.

19. The nonvolatile memory device according to claim 9, wherein the plurality of sense amplifiers, connected one by one to the plurality of bit lines, compare and amplify voltages of the bit lines with reference voltages when a sense amplifier enable signal is activated.

20. The nonvolatile memory device according to claim 9, wherein each of the plurality of phase change resistor cell arrays comprises a pair of a bit line and a bit line bar, and bit line pull-down devices corresponding to the bit line and the bit line bar, respectively.

21. The nonvolatile memory device according to claim 20, wherein each of the plurality of sense amplifiers is configured to correspond to the pair of the bit lines, and to amplify a voltage applied from the pair of the bit lines.

* * * * *